US009325308B2

(12) United States Patent
Liao

(10) Patent No.: US 9,325,308 B2
(45) Date of Patent: Apr. 26, 2016

(54) SEMICONDUCTOR DEVICE AND CASCODE CIRCUIT

(71) Applicant: DELTA ELECTRONICS, INC., Taoyuan Hsien (TW)

(72) Inventor: Wen-Chia Liao, Taoyuan Hsien (TW)

(73) Assignee: DELTA ELECTRONICS, INC. (TW)

( * ) Notice: Subject to any disclaimer, the term of this patent is extended or adjusted under 35 U.S.C. 154(b) by 193 days.

(21) Appl. No.: 14/291,654

(22) Filed: May 30, 2014

(65) Prior Publication Data

US 2015/0349771 A1    Dec. 3, 2015

(51) Int. Cl.
*H01L 23/50* (2006.01)
*H03K 17/16* (2006.01)
*H03K 17/687* (2006.01)

(52) U.S. Cl.
CPC .......... *H03K 17/162* (2013.01); *H03K 17/6871* (2013.01)

(58) Field of Classification Search
CPC ................ H01L 29/78; H01L 29/2003; H01L 29/66462; H01L 29/7786; H01L 23/31; H01L 23/50; H01L 27/08
USPC .............................................. 257/76, 77, 379
See application file for complete search history.

(56) References Cited

U.S. PATENT DOCUMENTS

| 5,621,362 | A * | 4/1997 | McKinney | H03B 5/1203 331/117 D |
| 7,982,239 | B2 | 7/2011 | McNutt et al. | |
| 8,536,931 | B2 | 9/2013 | Kobayashi et al. | |
| 2005/0077967 | A1* | 4/2005 | Behzad | H03F 1/223 330/311 |
| 2008/0230784 | A1* | 9/2008 | Murphy | H01L 27/0605 257/76 |
| 2009/0039869 | A1* | 2/2009 | Williams | G01R 19/0092 324/123 R |
| 2012/0175679 | A1* | 7/2012 | Marino | H01L 29/402 257/194 |
| 2012/0262220 | A1* | 10/2012 | Springett | H03K 17/04206 327/430 |
| 2013/0009165 | A1 | 1/2013 | Park et al. | |
| 2013/0193525 | A1* | 8/2013 | Weis | H03K 17/063 257/379 |
| 2014/0027785 | A1* | 1/2014 | Rose | H03K 17/08122 257/77 |
| 2014/0062585 | A1* | 3/2014 | Weis | H03K 17/102 327/541 |
| 2014/0145208 | A1* | 5/2014 | Rose | H03K 17/567 257/77 |
| 2014/0146428 | A1* | 5/2014 | Pansier | H03K 17/0822 361/86 |
| 2014/0300410 | A1* | 10/2014 | Buthker et al. | G05F 3/247 327/537 |
| 2015/0035586 | A1* | 2/2015 | Weis | H03K 17/687 327/436 |
| 2015/0303128 | A1* | 10/2015 | Otremba | H01L 25/105 257/676 |

FOREIGN PATENT DOCUMENTS

SG    EP 1085653 A1 *  3/2001  .............. H03F 1/223

* cited by examiner

*Primary Examiner* — Michael Lebentritt
(74) *Attorney, Agent, or Firm* — Hauptman Ham, LLP

(57) ABSTRACT

A semiconductor device and a cascode circuit are disclosed herein. The semiconductor device includes a first transistor and a second transistor. The first transistor includes a first electrode, a second electrode, a control electrode, and a control pad. The second transistor includes a first electrode, a second electrode, a control electrode, and a control pad. The second electrode of the first transistor is configured to receive a first predetermined voltage. The control electrode of the first transistor is configured to receive an input signal. The first electrode of the second transistor configured to receive a second predetermined voltage. The second electrode of the second transistor is electrically coupled to the first electrode of the first transistor. The control pad is disposed between the first electrode of the second transistor and the control electrode of the second transistor, and is configured to receive a first adjust signal.

20 Claims, 6 Drawing Sheets

… (1)

SEMICONDUCTOR DEVICE AND CASCODE CIRCUIT

BACKGROUND

1. Technical Field

The present application relates to a semiconductor device. More particularly, the present application relates to a cascode circuit with a tunable capacitance.

2. Description of Related Art

Demands for power circuit that is able to supply higher power have increased in recent developments. The higher power allows the power circuit to operate more efficiently.

Power transistors are able to withstand high voltages and currents, and thus are utilized for power circuits. However, parasitic capacitances that arise in the power transistors are substantially formed during the manufacturing process. The switching loss in the power circuit is caused from the parasitic capacitances. As a result, the efficiency of the power circuit is reduced.

Therefore, a heretofore-unaddressed need exists to address the aforementioned deficiencies and inadequacies.

SUMMARY

One aspect of the present disclosure is to provide a semiconductor device. The semiconductor device includes a first transistor and a second transistor. The first transistor includes a first electrode, a second electrode, a control electrode, and a control electrode. The second transistor includes a first electrode, a second electrode, a control electrode, and a control pad. The second electrode of the first transistor is configured to receive a first predetermined voltage. The control electrode of the first transistor is configured to receive an input signal. The first electrode of the second transistor configured to receive a second predetermined voltage. The second electrode of the second transistor is electrically coupled to the first terminal of the first transistor. The control pad is disposed between the first terminal of the second transistor and the control terminal, and configured to receive a first adjust signal.

Another aspect of the present disclosure is to provide a semiconductor device. The semiconductor device includes a substrate, a high voltage transistor, a low voltage transistor, a first terminal, a second terminal, a third terminal, and a fourth terminal. The high voltage transistor is disposed on the substrate, and includes a first source electrode, a first drain electrode, a first gate electrode, and a field plate disposed between the first gate electrode and the first drain electrode. The low voltage transistor is disposed on the substrate, and includes a second source electrode, a second drain electrode, and a second gate electrode. The second drain electrode is electrically coupled to the first source electrode. The first terminal is coupled to the first drain electrode. The second terminal is coupled to the second source electrode. The third terminal is coupled to the second gate electrode for receiving a control signal. The fourth terminal is coupled to the field plate of the high voltage transistor for controlling a capacitance of the semiconductor device.

It is to be understood that both the foregoing general description and the following detailed description are by examples, and are intended to provide further explanation of the invention as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
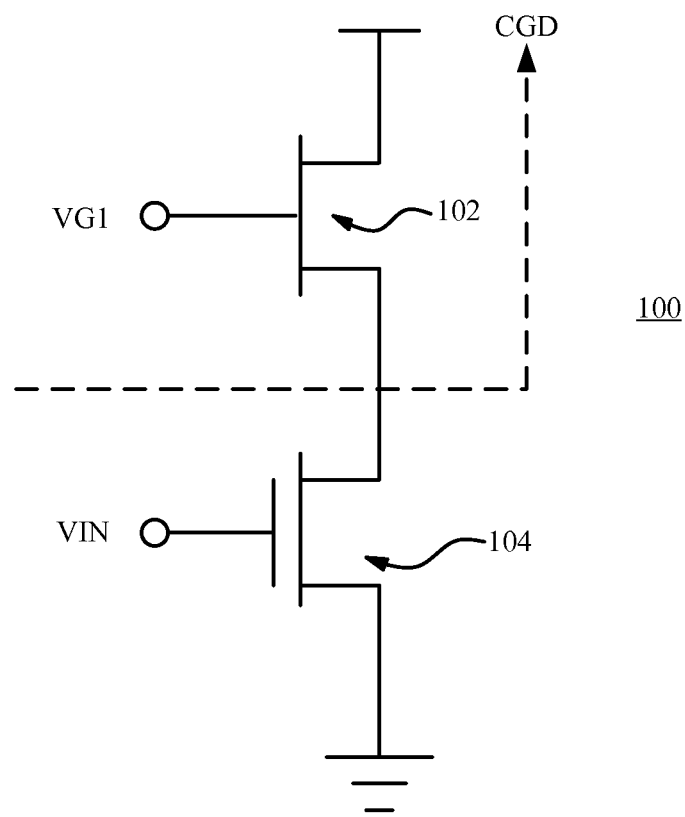
FIG. 1 is a schematic diagram of a power device used in some approaches.

Reference will now be made in detail to the present embodiments of the present disclosure, examples of which are illustrated in the accompanying drawings. Wherever possible, the same reference numbers are used in the drawings and the description to refer to the same or like parts.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Although the terms "first," "second," etc., may be used herein to describe various elements, these elements should not be limited by these terms. These terms are used to distinguish one element from another.

FIG. 1 is a schematic diagram of a power device 100 used in some approaches. As shown in FIG. 1, the power device 100 includes a depletion mode (referred as "D-mode" hereinafter) transistor 102 and an enhanced mode (referred as "E-mode" hereinafter) transistor 104. The D-mode transistor 102 is electrically coupled to the E-mode transistor 104 in cascode. In practical applications, the gate electrode of the D-mode transistor 102 is floating or configured to receive a desired voltage VG1. The gate electrode of the E-mode transistor 102 is configured to receive an input signal VIN for proper operations.

As mentioned above, the parasitic capacitances are present in the power device 100. For illustration, as shown in FIG. 1, an equivalent gate-drain capacitance CGD is substantially formed in the power device 100, and is able to be estimated from an analysis of certain parasitic capacitance models. In practical applications, the switching loss of a power device 100 is related to the equivalent gate-drain capacitance CGD. Therefore, the equivalent gate-drain capacitance CGD is required to be adjusted to meet different requirements of practical applications.

Figure 2A:
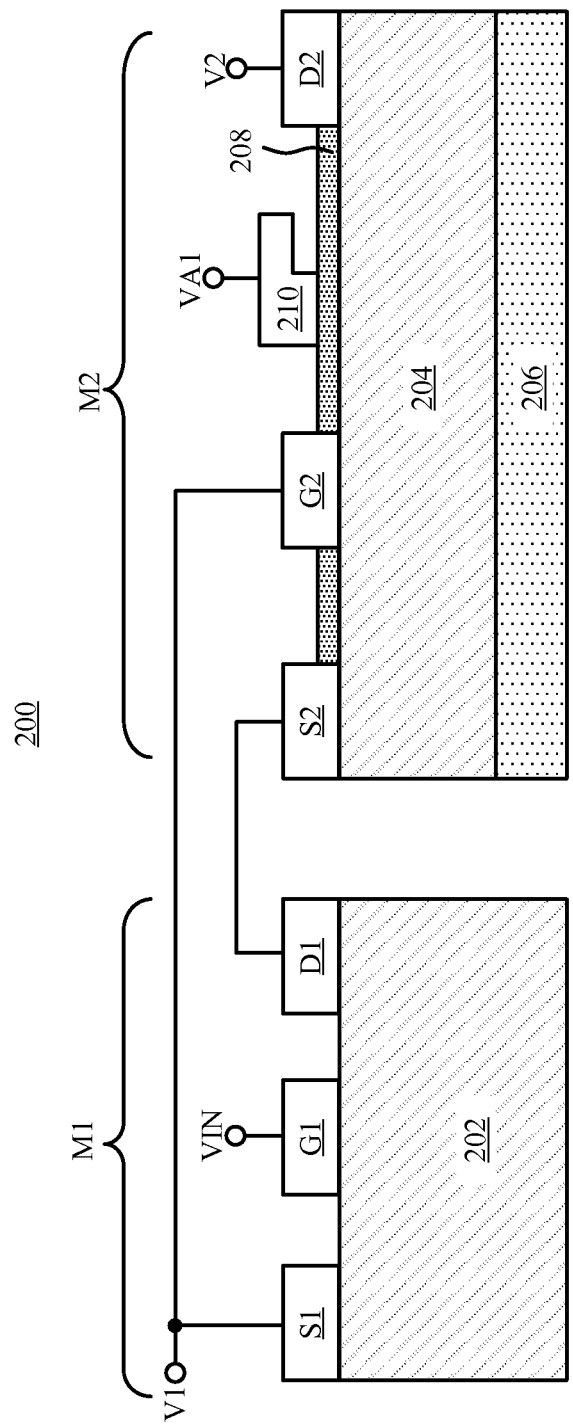
FIG. 2A is a schematic diagram illustrating a cross-section view of a cascode circuit in accordance with one embodiment of the present disclosure.

Reference is made to FIG. 2A. FIG. 2A is a schematic diagram illustrating a cross-section view of a cascode circuit 200 in accordance with one embodiment of the present disclosure. As shown in FIG. 2A, the cascode circuit 200 includes a transistor M1 and a transistor M2. The transistor M1 includes a gate electrode G1, a drain electrode D1, a source electrode S1, and a semiconductor layer 202. The transistor M2 includes a gate electrode G2, a drain electrode D2, a source electrode S2, a semiconductor layer 204, a substrate 206, a passivation layer 208, and a control pad 210.

In various embodiments of the present disclosure, the cascode circuit 200 is able to substantially form a merged cascode transistor having an ability of withstanding high voltage. In some embodiments, the transistor M1 is a low voltage transistor, and the transistor M2 is a high voltage transistor. In some other embodiments, the transistor M1 is an E-mode transistor (i.e., a normally-off transistor), and the transistor M2 is a D-mode transistor (i.e., a normally-on transistor). For illustration, the semiconductor layer 202 includes a silicon layer, and the semiconductor layer 204 is made of iii-nitride materials or any III-V compounds. In an embodiment, the semiconductor layer 204 includes nitride-based semiconductor layers, such as an AlGaN layer stacked on a GaN layer, and the transistor M2 is a high electron mobility transistor (HEMT).

In some other embodiments, the transistor M1 and the transistor M2 include any type of field effect transistor (FET). Various types of the transistors M1 and M2 in FIG. 2A are within the contemplated scope of the present disclosure.

To be explained in detail, as shown in FIG. 2A, the gate electrode G1 is disposed between the source electrode S1 and the drain electrode D1, and the gate electrode G2 is disposed between the drain electrode D2 and the source electrode S2. The gate electrode G2, the source electrode S2, and the drain electrode D2 are formed on the semiconductor layer 204, and the semiconductor layer 204 is disposed on the substrate 206. In some embodiments, the transistor M2 can be formed on the substrate 206 monolithically.

As shown in FIG. 2A, the gate electrode G1 of the transistor M1 is configured to receive an input signal VIN, the drain electrode D1 of the transistor M1 is electrically coupled to the source electrode S2 of the transistor M2, and the source electrode S1 of the transistor M1 is configured to receive a predetermined voltage V1. For illustration, in some embodiments, the source electrode S1 of the transistor M1 is able to be electrically coupled to ground to receive a ground voltage. The drain electrode D2 of the transistor M2 is configured to receive a predetermined voltage V2, such as a supply voltage.

In this embodiment, the gate electrode G2 of the transistor M2 is electrically coupled to the source electrode S1 of the transistor M1. Thus, when the input signal VIN is at a low voltage level, the transistor M1 is turned off, and a negative voltage is accordingly generated between the source electrode S2 and the gate electrode G2 of the transistor M2 to turn off the transistor M2. Thus, the cascode circuit 200 is able to be entirely turned off when the input signal VIN is at the low voltage level.

Further, as shown in FIG. 2A, the passivation layer 208 is disposed on the semiconductor layer 204 to protect the transistor M2 from degradations. In some embodiments, the passivation layer 209 is made of SiO2, SiN, SiO2, etc.

The control pad 210 is disposed on the passivation layer 208 and between the gate electrode G2 and the drain electrode D2. In various embodiments, the control pad 210 includes a field plate, but the present disclosure is not limited thereto. In this embodiment, the control pad is configured to receive a adjust signal VA1, so as to control a capacitance of the cascode circuit 200.

Compared to the power device 100 in FIG. 1, an additional parasitic capacitance (not shown) may be substantially generated from the control pad 210, and the additional parasitic capacitance and the others parasitic capacitance in the transistor M2 are able to be controlled by the adjust signal VA1. With such a configuration, the equivalent gate-drain capacitance CGD of the cascode circuit 200 is able to be adjusted by the adjust signal VA1. Thus, the cascode circuit 200 can be more widely utilized in different applications.

Moreover, in some embodiments of the present disclosure, the transistor M1 and the transistor M2 can be formed on one chip. For illustration, as a whole, a first terminal of the cascode circuit 200 is coupled to the drain electrode D2, a second terminal of the cascode circuit 200 is coupled to the source electrode S1, a third terminal of the cascode circuit 200 is coupled to the gate electrode G1, and a fourth terminal of the cascode circuit 200 is coupled to the control pad 210. Thus, the predetermined voltages V1 and V2, the input signal VIN, and the adjust signal VA can be transmitted to the corresponding electrodes of the cascode circuit 200 through the terminals of the chip. Alternatively, in some other embodiments of the present disclosure, the transistor M1 is formed on one chip, and the transistor M2 is formed on another one chip, and the two chips can be packaged in one package. The package includes a metal substrate, a leadframe, a printed circuit board, or the like. With such configurations, the cascode circuit 200 can be fully integrated.

Figure 2B:
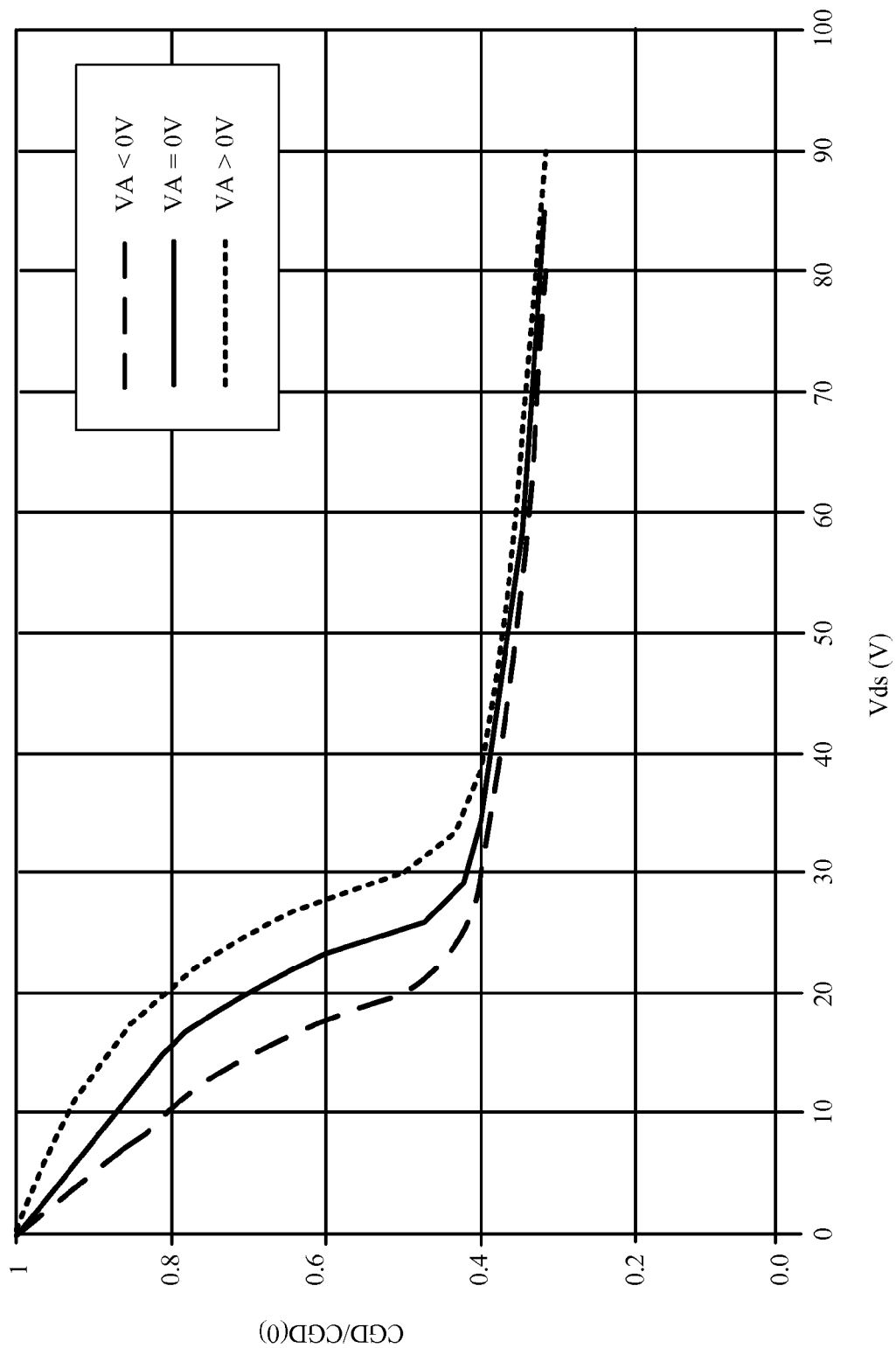
FIG. 2B is a graph illustrating a relation of an equivalent gate-drain capacitance of the cascode circuit in FIG. 2A and the adjust signal according one embodiment of the present disclosure.

Reference is made to FIG. 2B. FIG. 2B is a graph illustrating a relation of an equivalent gate-drain capacitance CGD of the cascode circuit 200 in FIG. 2A and the adjust signal VA1 according one embodiment of the present disclosure.

As shown in FIG. 2B, a voltage VDS in FIG. 2B indicates a voltage between the drain electrode D2 and the source electrode S1 of the cascode circuit 200. Ggd(0) indicates the equivalent gate-drain capacitance CGD of the cascode circuit 200 when the voltage VDS is 0 Volts. As illustrated in FIG. 2B, the equivalent gate-drain capacitance CGD can be adjusted with different values of the adjust signal VA1 according to the voltage VDS. For illustration, if the voltage VDS of the cascode circuit 200 is about 20 volts, the adjust signal VA1 can be set to be less than 0 volts to obtain a lower equivalent gate-drain capacitance CGD. Alternatively, if the voltage VDS of the cascode circuit 200 is about 20 volts, the adjust signal VA1 can be set to be greater than 0 volts to obtain a higher equivalent gate-drain capacitance CGD. One of person having ordinary skill in the art can set the voltage of the adjust signal VA1 according to practical applications.

Figure 3:
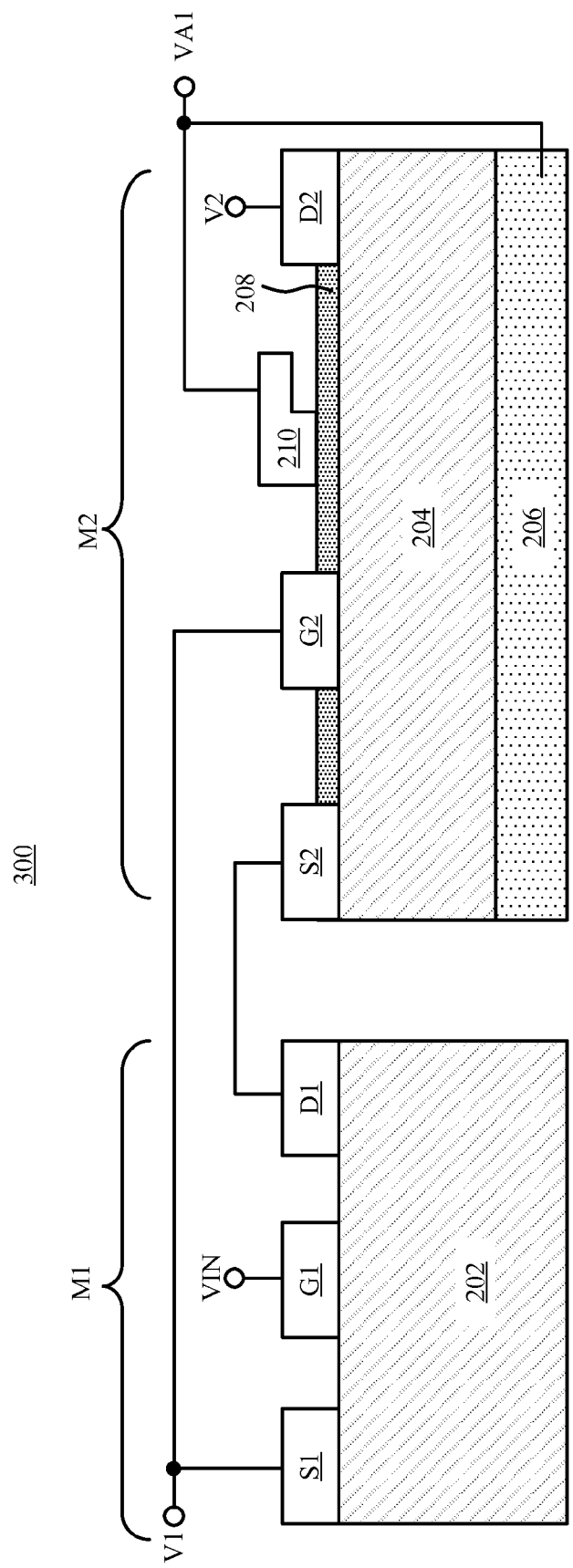
FIG. 3 is a schematic diagram illustrating a cross-section view of a cascode circuit in accordance with one embodiment of the present disclosure.

Reference is made to FIG. 3. FIG. 3 is a schematic diagram illustrating a cross-section view of a cascode circuit 300 in accordance with one embodiment of the present disclosure.

Compared to the cascode circuit 200 in FIG. 2A, in this embodiment, the substrate 206 of the cascode circuit 300 is further electrically coupled to the control pad 210. Thus, with such a configuration, a different range of the equivalent gate-drain capacitance CGD is achieved.

Figure 4:
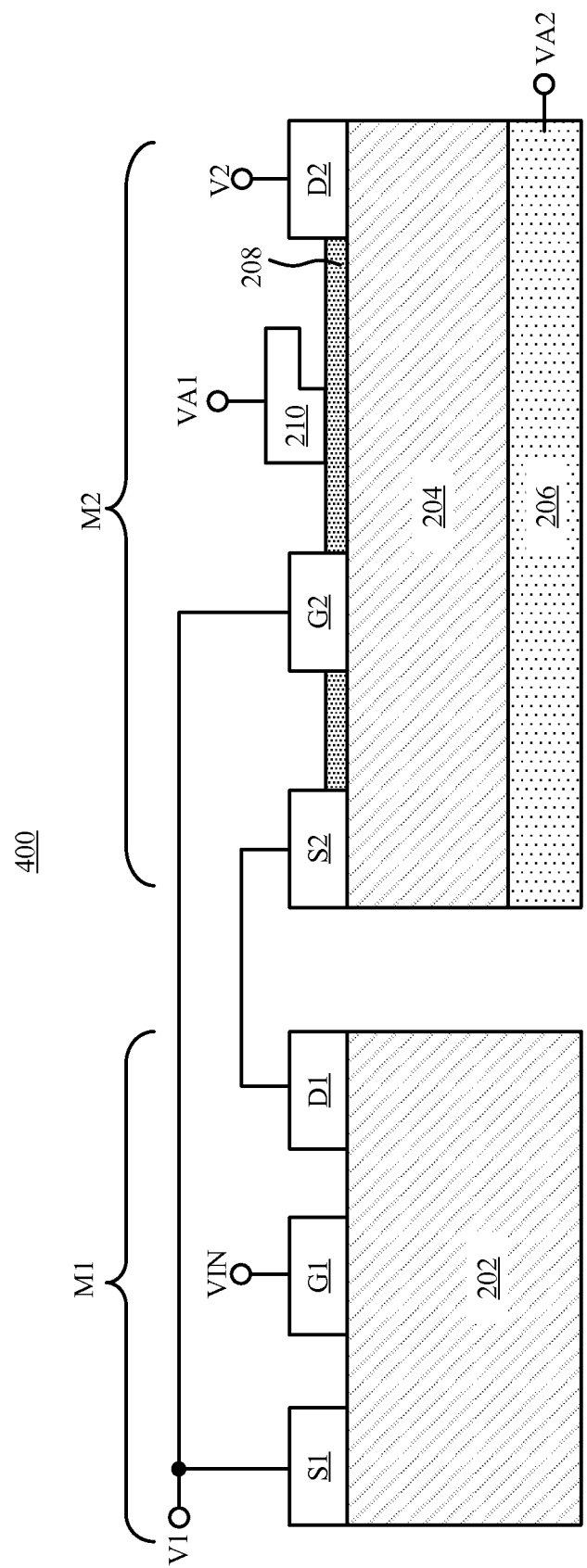
FIG. 4 is a schematic diagram illustrating a cross-section view of a cascode circuit in accordance with one embodiment of the present disclosure.

Reference is made to FIG. 4. FIG. 4 is a schematic diagram illustrating a cross-section view of a cascode circuit 400 in accordance with one embodiment of the present disclosure.

Compared to the cascode circuit 200, as shown in FIG. 4, the substrate 206 of the cascode circuit 400 is further configured to receive an adjust signal VA2. Parasitic capacitances, which are formed between the sources electrode S2 and the substrate 206, between the gate electrode G2 and the substrate 206, between the drain electrode D2 and the substrate 206, or between the control pad 210 and the substrate 206, are able to be controlled by the adjust signal VA2.

In other words, in this embodiment, the equivalent gate-drain capacitance CGD of the cascode circuit 400 is able to be adjusted by both of the adjust signal VA1 and the adjust signal VA2. Therefore, the different range of equivalent gate-drain capacitance CGD can be set with the configuration of the adjust signal VA2.

Figure 5:
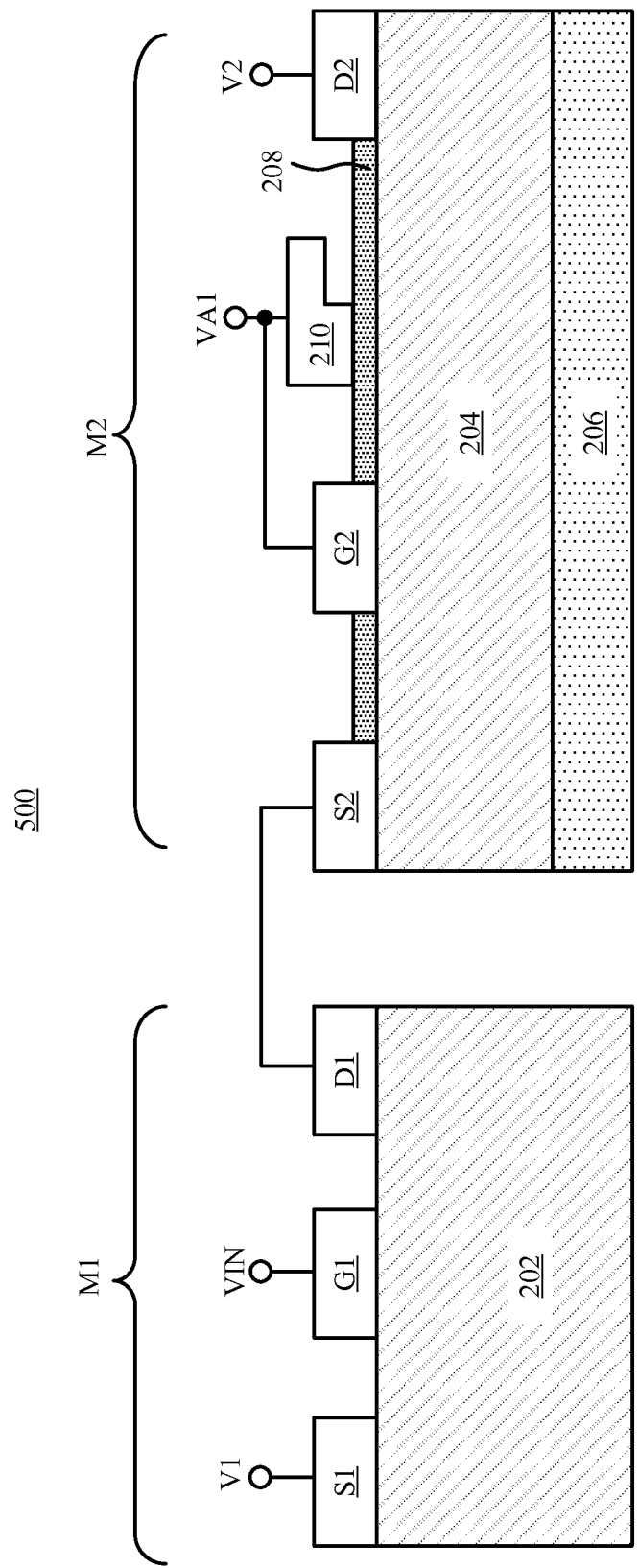
FIG. 5 is a schematic diagram illustrating a cross-section view of a cascode circuit in accordance with one embodiment of the present disclosure.

Reference is made to FIG. 5. FIG. 5 is a schematic diagram illustrating a cross-section view of a cascode circuit 500 in accordance with one embodiment of the present disclosure.

Compared to the embodiments illustrated above, as shown in FIG. 5, the gate electrode G2 of the cascode circuit 500 is configured to be electrically coupled to the control pad 210 rather than the source electrode S1. In this embodiment, the gate-drain capacitance (not shown) between the gate electrode G2 and the drain electrode D2 of the transistor M2 is able to be adjusted by applying the adjust signal VA1 on both of the gate electrode G2 and the control pad 210. Thus, the equivalent gate-drain capacitance CGD of the cascode circuit 500 can be further tuned with such configuration.

The structure and the arrangement of the control pad 210 in FIG. 2A, FIG. 3, FIG. 4, and FIG. 5 are given for illustrative purposes. Various configurations for the control pad 210 or the combination of the embodiments above, which are able to tune the equivalent gate-drain capacitance CGD, are within the contemplated scope of the present disclosure.

In summary, the cascode circuit of the present disclosure is able to adjust an equivalent gate-drain capacitance CGD of the cascode circuit with numerous configurations. Thus, the cascode circuit can be widely utilized with different requirements of the switch loss.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A semiconductor device, comprising:
    a first transistor, comprising:
        a first electrode;
        a second electrode configured to receive a first predetermined voltage; and
        a control electrode configured to receive an input signal; and
    a second transistor comprising:
        a first electrode configured to receive a second predetermined voltage;
        a second electrode electrically coupled to the first terminal of the first transistor;
        a control electrode; and
        a control pad disposed between the first electrode of the second transistor and the control electrode of the second transistor, and configured to receive a first adjust signal.

2. The semiconductor device of claim 1, wherein the control electrode of the second transistor is electrically coupled to the second electrode of the first transistor.

3. The semiconductor device of claim 2, wherein the second transistor is disposed on a substrate, and the substrate is electrically coupled to the control pad of the second transistor.

4. The semiconductor device of claim 1, wherein the second transistor is disposed on a substrate, and the substrate is configured to receive a second adjust signal.

5. The semiconductor device of claim 1, wherein the control electrode of the second transistor is electrically coupled to the control pad.

6. The semiconductor device of claim 1, wherein the first transistor is a normally-on transistor, and the second transistor is a normally-off transistor.

7. The semiconductor device of claim 1, wherein the control pad comprises a field plate.

8. The semiconductor device of claim 1, wherein the first transistor and the second transistor are formed on a same chip.

9. The semiconductor device of claim 1, wherein the first transistor is formed on a first chip, the second transistor is formed on a second chip, and the first chip and the second chip are packaged in a package.

10. The semiconductor device of claim 9, wherein the package comprises a metal substrate or a leadframe.

11. A semiconductor device comprising:
    a substrate;
    a high voltage transistor disposed on the substrate, the high voltage transistor comprising a first source electrode, a first drain electrode, a first gate electrode, and a field plate disposed between the first gate electrode and the first drain electrode;
    a low voltage transistor disposed on the substrate, the low voltage transistor comprising a second source electrode, a second drain electrode, and a second gate electrode, the second drain electrode being electrically coupled to the first source electrode;
    a first terminal coupled to the first drain electrode;
    a second terminal coupled to the second source electrode; S1
    a third terminal coupled to the second gate electrode for receiving a control signal; and
    a fourth terminal coupled to the field plate of the high voltage transistor for controlling a capacitance of the semiconductor device.

12. The semiconductor device of claim 11, wherein the first gate electrode is electrically coupled to the second source electrode.

13. The semiconductor device of claim 11, wherein the first gate electrode is electrically coupled to the substrate.

14. The semiconductor device of claim 11, wherein the high voltage transistor and the low voltage transistor are formed on a same chip.

15. The semiconductor device of claim 11, wherein the high voltage transistor is formed on a first chip, the low voltage transistor is formed on a second chip, and the first chip and the second chip are packaged in a package.

16. The semiconductor device of claim 15, wherein the package comprises a metal substrate or a leadframe.

17. The semiconductor device of claim 11, wherein the high voltage transistor is a normally-on transistor, and the low voltage transistor is a normally-off transistor.

18. The semiconductor device of claim 11, wherein the high voltage transistor is a nitride-based high electron mobility transistor (HEMT) and the low voltage transistor is a silicon-based transistor.

19. The semiconductor device of claim 11, wherein the first gate electrode is electrically coupled to the field plate of the high voltage transistor.

20. The semiconductor device of claim 11, wherein the field plate of the high voltage transistor is coupled to the substrate.

* * * * *